United States Patent
Curtis et al.

(10) Patent No.: US 6,666,922 B2
(45) Date of Patent: *Dec. 23, 2003

(54) SYSTEM FOR PROCESSING A WORKPIECE

(75) Inventors: Gary L Curtis, Kila, MT (US); Raymon F. Thompson, Kalispell, MT (US)

(73) Assignee: Semitool, Inc., Kalispell, MT (US)

( * ) Notice: Subject to any disclaimer, the term of this patent is extended or adjusted under 35 U.S.C. 154(b) by 130 days.

This patent is subject to a terminal disclaimer.

(21) Appl. No.: 09/921,845

(22) Filed: Aug. 2, 2001

(65) Prior Publication Data

US 2002/0023717 A1 Feb. 28, 2002

Related U.S. Application Data

(62) Division of application No. 09/041,901, filed on Mar. 13, 1998, now Pat. No. 6,350,319.

(51) Int. Cl.[7] .................................................. C23C 16/00
(52) U.S. Cl. .................... 118/719; 118/500; 118/715
(58) Field of Search ............................ 118/715, 719, 118/722, 728, 729, 730, 500; 134/153, 157, 199, 902; 156/345.23

(56) References Cited

U.S. PATENT DOCUMENTS

| | | |
|---|---|---|
| 3,727,620 A | 4/1973 | Orr |
| 3,953,265 A | 4/1976 | Hood |
| 4,132,567 A | 1/1979 | Blackwood |
| 4,439,243 A | 3/1984 | Titus |
| 4,439,244 A | 3/1984 | Allevato |
| 4,544,446 A | 10/1985 | Cady |
| 4,664,133 A | 5/1987 | Silvernail et al. |
| 4,750,505 A | 6/1988 | Inuta et al. |
| 4,790,262 A | 12/1988 | Nakayama et al. |
| 4,838,289 A | 6/1989 | Kottman et al. |
| 4,903,717 A | 2/1990 | Sumnitsch |
| 4,982,215 A | 1/1991 | Matsuoka |
| 4,982,753 A | 1/1991 | Grebinski, Jr. et al. |
| 5,020,200 A | 6/1991 | Mimasaka |
| 5,032,217 A | 7/1991 | Tanaka |
| 5,117,769 A | 6/1992 | DeBoer et al. |
| 5,168,886 A | 12/1992 | Thompson et al. |
| 5,209,180 A | 5/1993 | Shoda et al. |
| 5,222,310 A | 6/1993 | Thompson et al. |
| 5,224,503 A | 7/1993 | Thompson et al. |
| 5,224,504 A | 7/1993 | Thompson et al. |
| 5,349,978 A | 9/1994 | Sago et al. |
| 5,361,449 A | 11/1994 | Akimoto |
| 5,421,893 A | 6/1995 | Perlov |
| 5,431,421 A | 7/1995 | Thompson et al. |
| 5,445,172 A | 8/1995 | Thompson et al. |
| 5,513,594 A | 5/1996 | McClanahan et al. |
| 5,551,986 A | 9/1996 | Jain |
| 5,591,262 A | 1/1997 | Sago et al. |
| 5,616,069 A | 4/1997 | Walker et al. |
| 5,666,985 A | 9/1997 | Smith, Jr. et al. |
| 5,677,824 A | 10/1997 | Harashima et al. |
| 5,678,116 A | 10/1997 | Sugimoto et al. |

(List continued on next page.)

FOREIGN PATENT DOCUMENTS

| | | |
|---|---|---|
| JP | 59-208831 | 11/1984 |
| JP | 60-137016 | 7/1985 |
| JP | 61-196534 | 8/1986 |

(List continued on next page.)

*Primary Examiner*—Gregory Mills
*Assistant Examiner*—Sylvia R. MacArthur
(74) *Attorney, Agent, or Firm*—Perkins Coie LLP

(57) ABSTRACT

An apparatus for processing a workpiece in a microenvironment includes a workpiece housing connected to a motor for rotation. The workpiece housing forms a substantially closed processing chamber where one or more processing fluids are distributed across at least one face of the workpiece by centrifugal force generated during rotation of the housing. Multiple housings may be vertically stacked and rotated about a common rotation axis to simultaneously process multiple workpieces in a small space.

21 Claims, 13 Drawing Sheets

U.S. PATENT DOCUMENTS

| | | | |
|---|---|---|---|
| 5,718,763 A | 2/1998 | Tateyama et al. | |
| 5,762,708 A | 6/1998 | Motoda et al. | |
| 5,762,751 A | 6/1998 | Bleck et al. | |
| 5,779,796 A | 7/1998 | Tomoeda et al. | |
| 5,815,762 A | 9/1998 | Sakai et al. | |
| 5,845,662 A | 12/1998 | Sumnitsch | |
| 5,860,640 A | 1/1999 | Marohl et al. | |
| 5,868,866 A | 2/1999 | Maekawa et al. | |
| 5,882,433 A | 3/1999 | Ueno | |
| 5,885,755 A | 3/1999 | Nakagawa et al. | |
| 5,916,366 A | 6/1999 | Ueyama et al. | |
| 5,942,035 A | 8/1999 | Hasebe et al. | |
| 5,997,653 A | 12/1999 | Yamasaka | |
| 6,264,752 B1 * | 7/2001 | Curtis et al. | 118/729 |
| 6,350,319 B1 * | 2/2002 | Curtis et al. | 118/715 |
| 6,494,956 B2 * | 12/2002 | Curtis et al. | 118/715 |

FOREIGN PATENT DOCUMENTS

| | | |
|---|---|---|
| JP | 62-166515 | 7/1987 |
| JP | 63-185029 | 7/1988 |
| JP | 1-120023 | 5/1989 |
| JP | 4 94537 | 3/1992 |
| JP | 5-13322 | 1/1993 |
| JP | 5-21332 | 1/1993 |
| JP | 5-326483 | 12/1993 |
| JP | 6-45302 | 2/1994 |
| JP | 52-12576 | 1/1997 |
| JP | 1-283845 | 11/1999 |

* cited by examiner

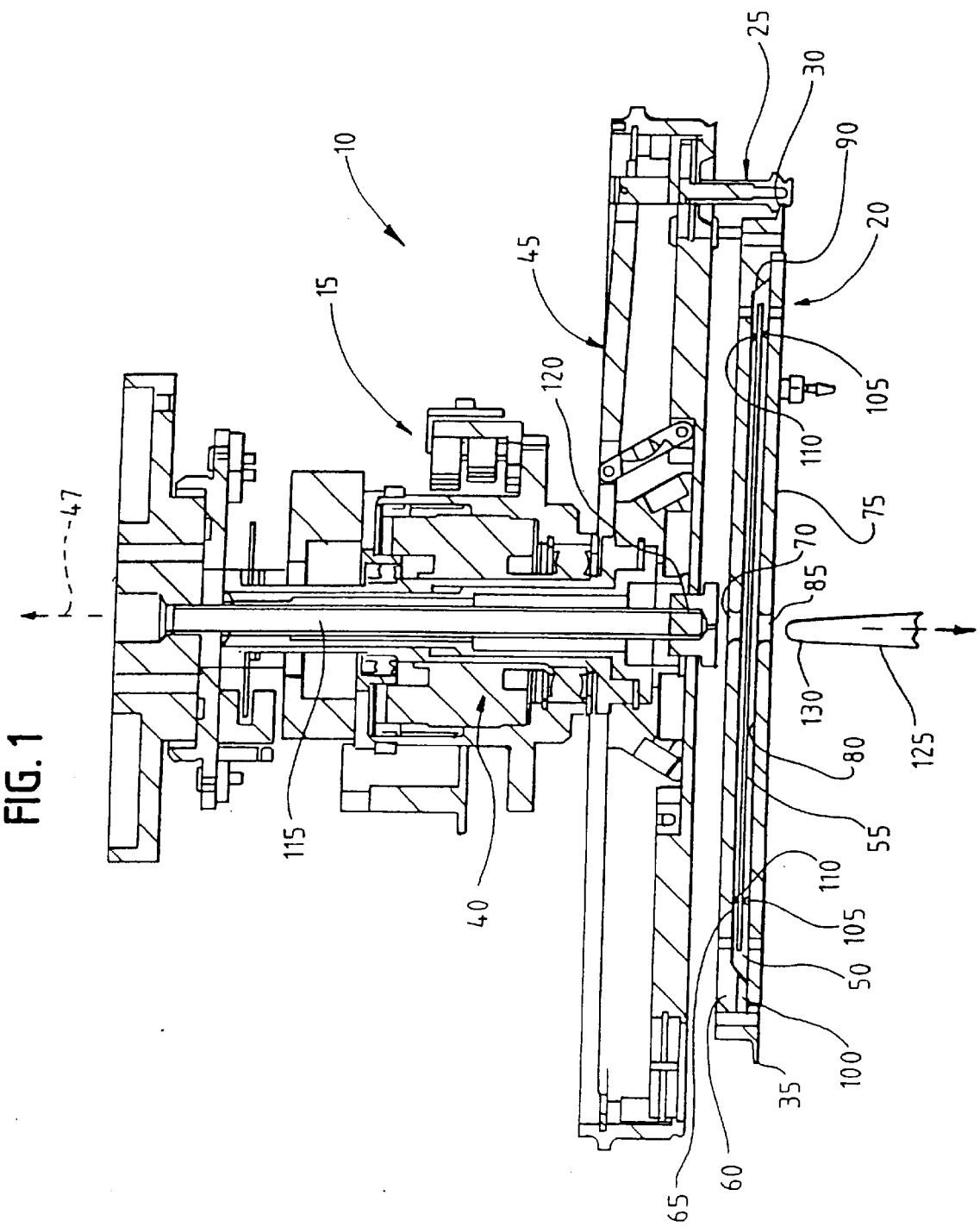

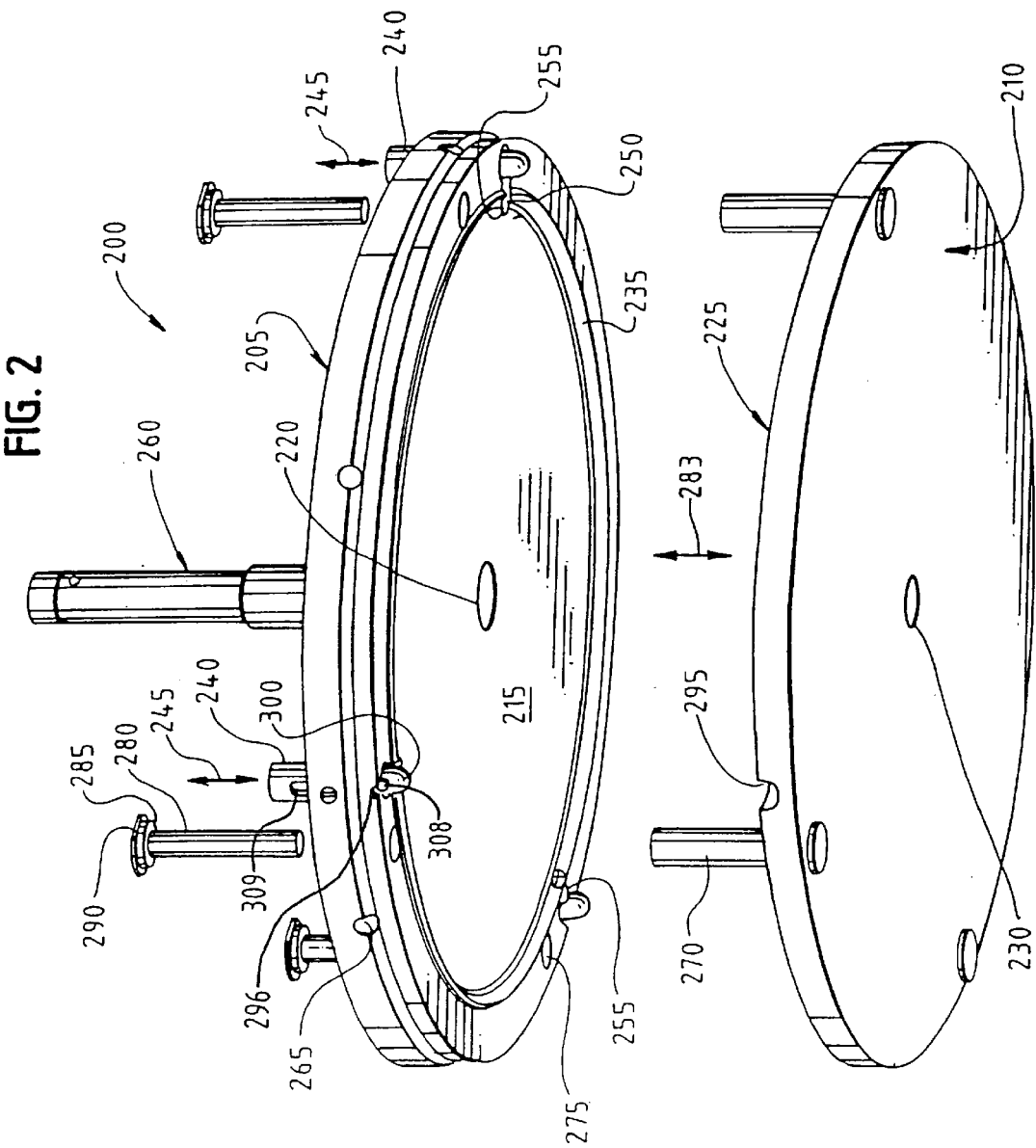

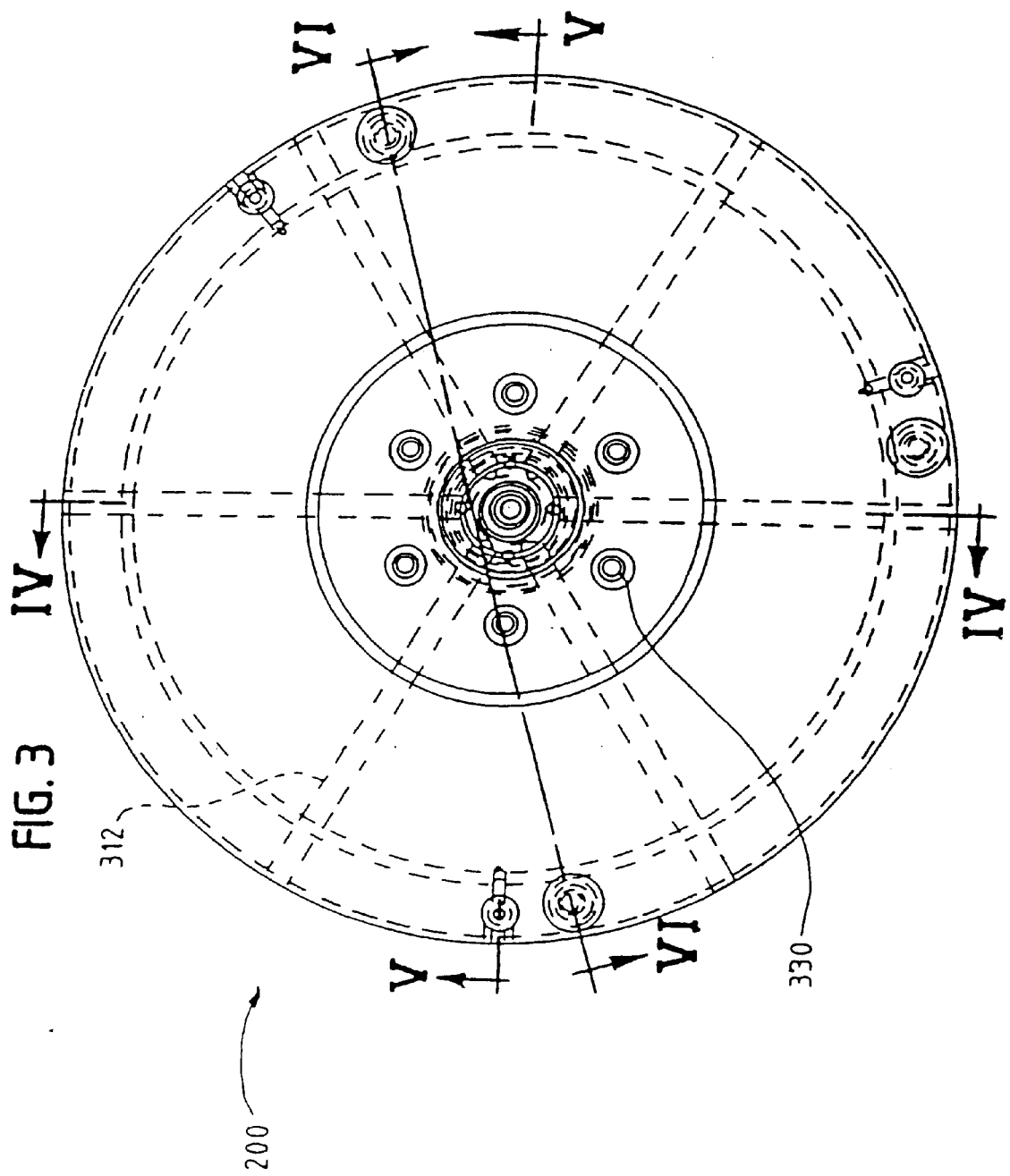

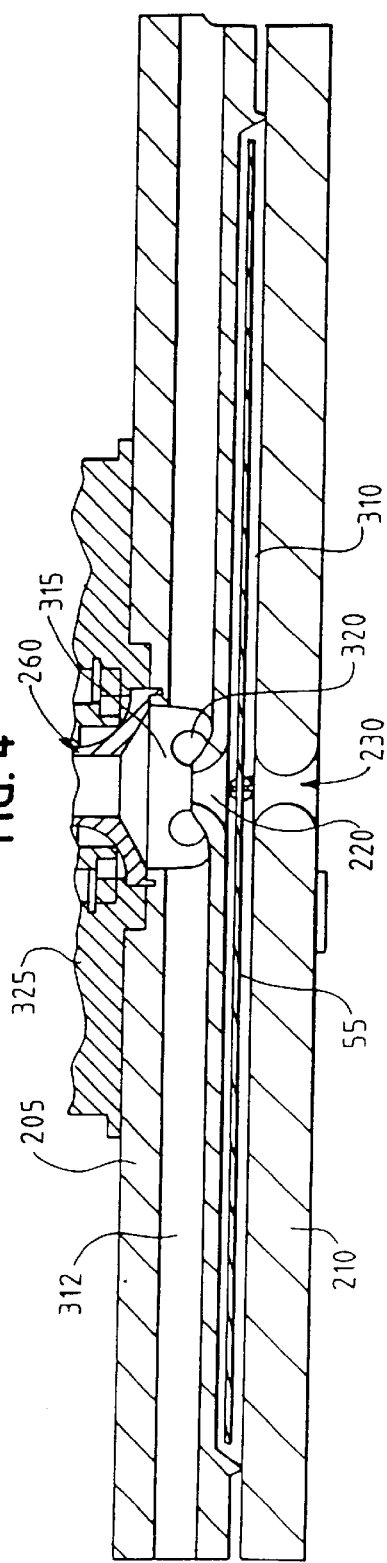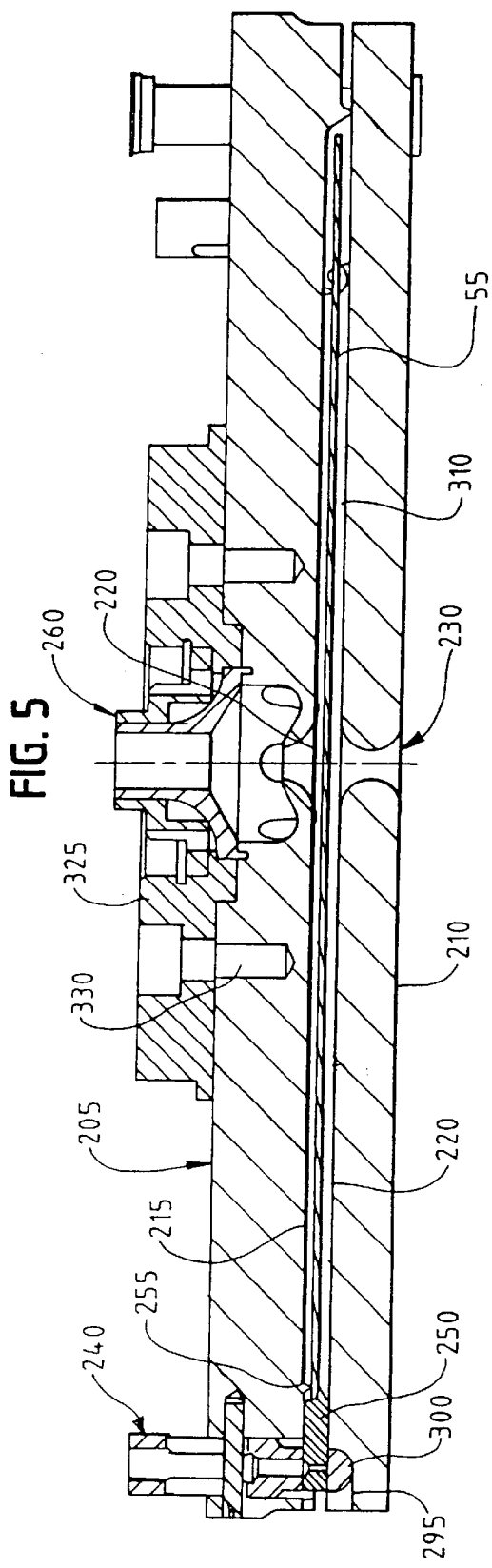

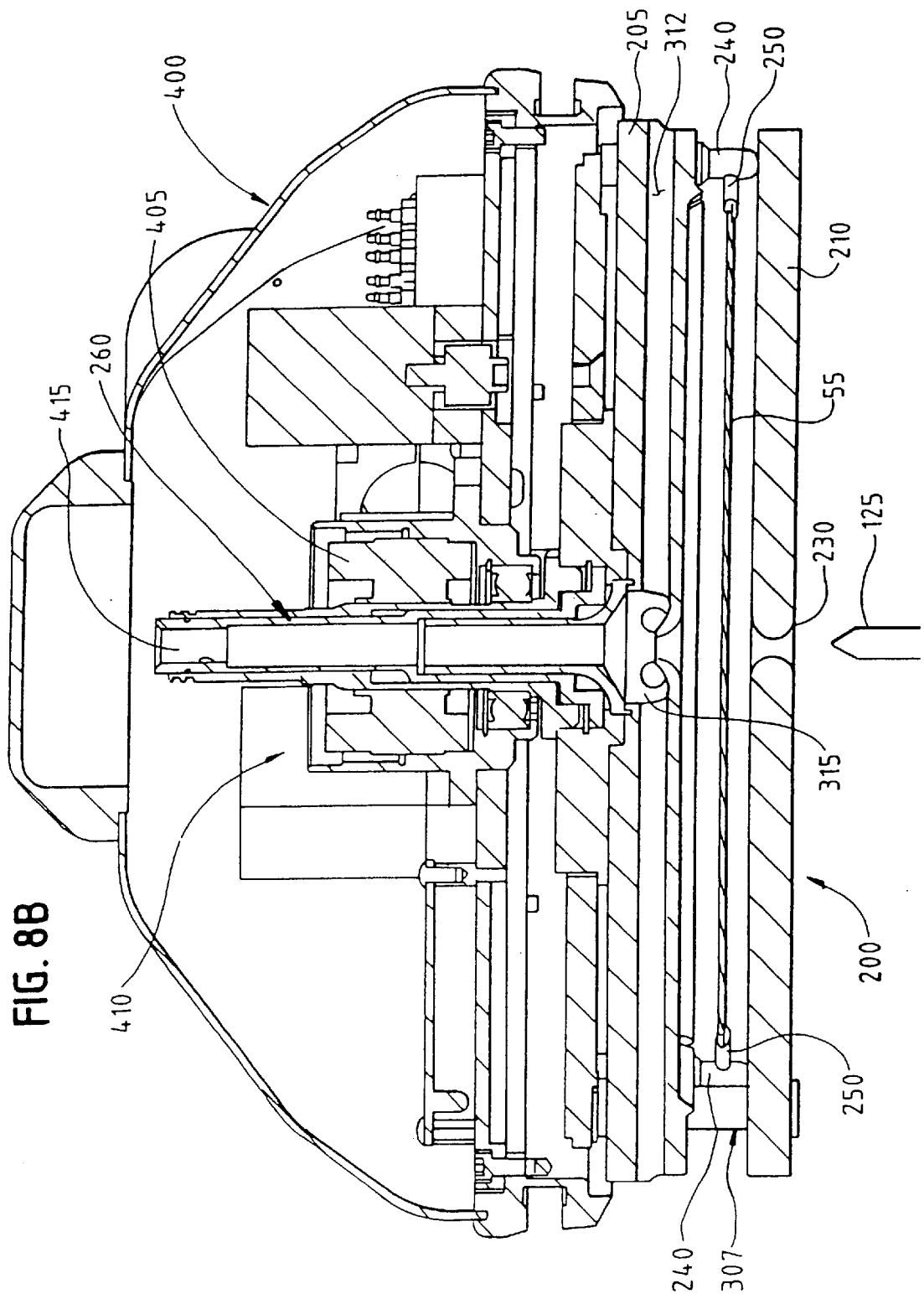

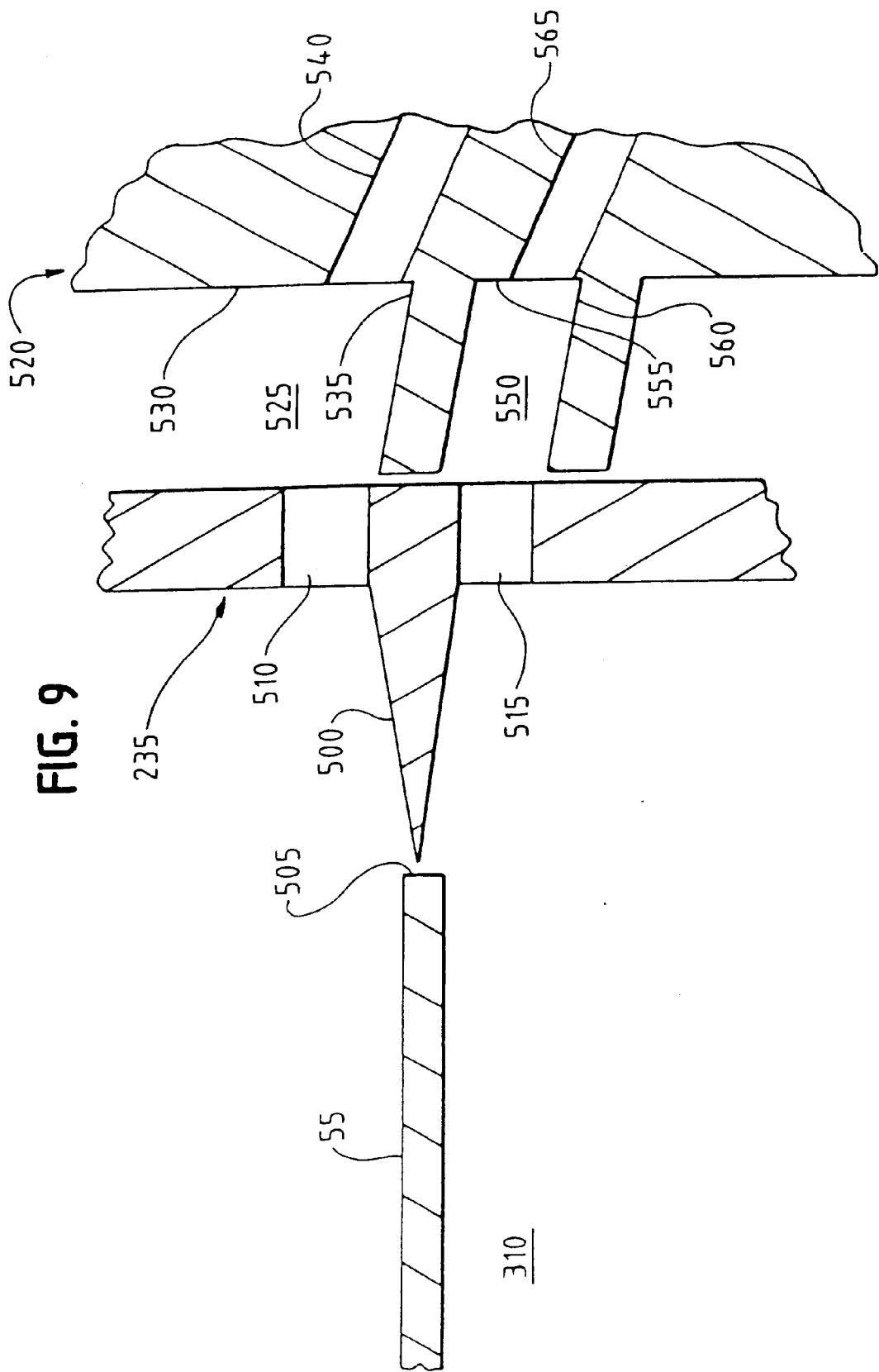

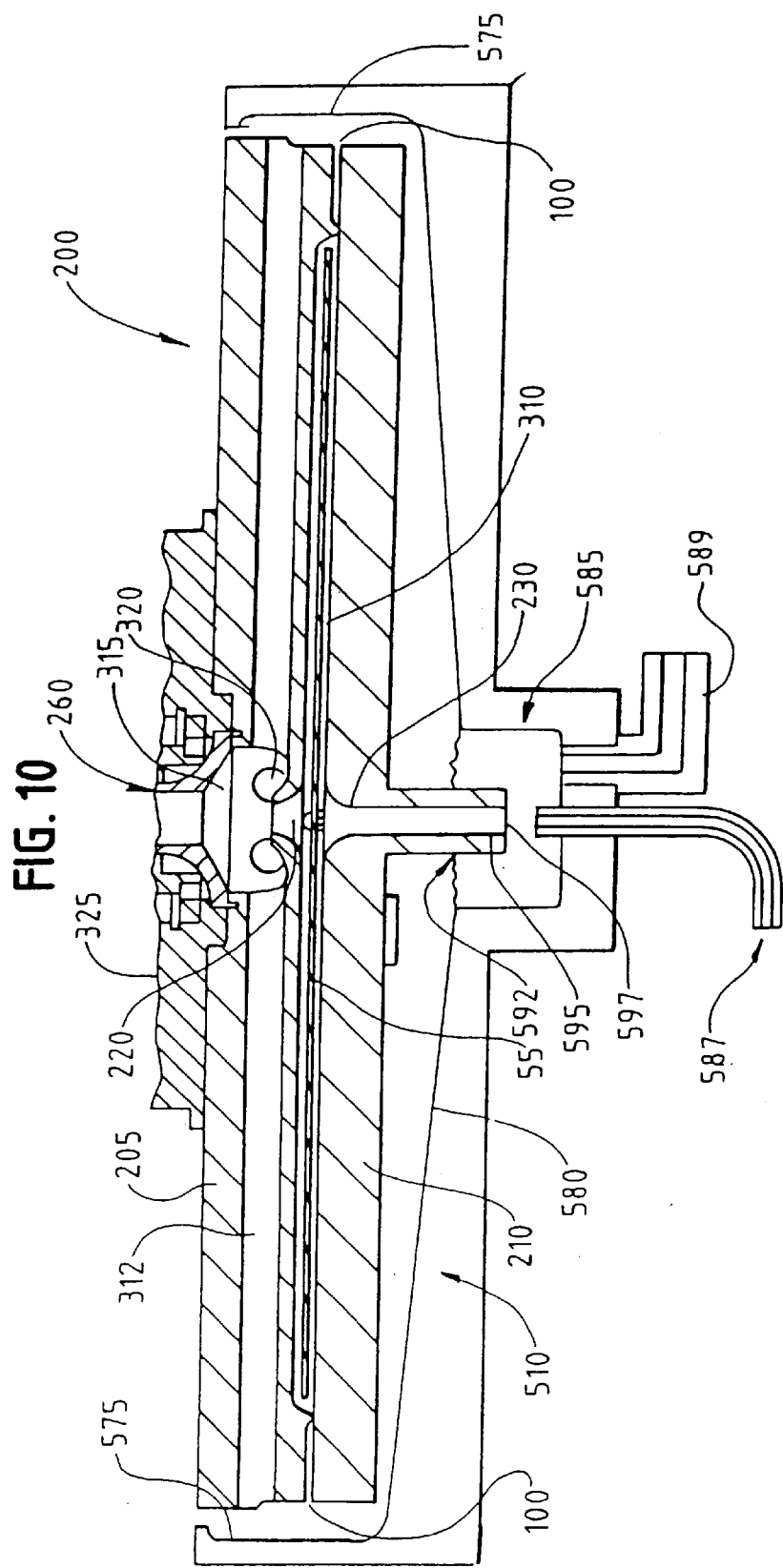

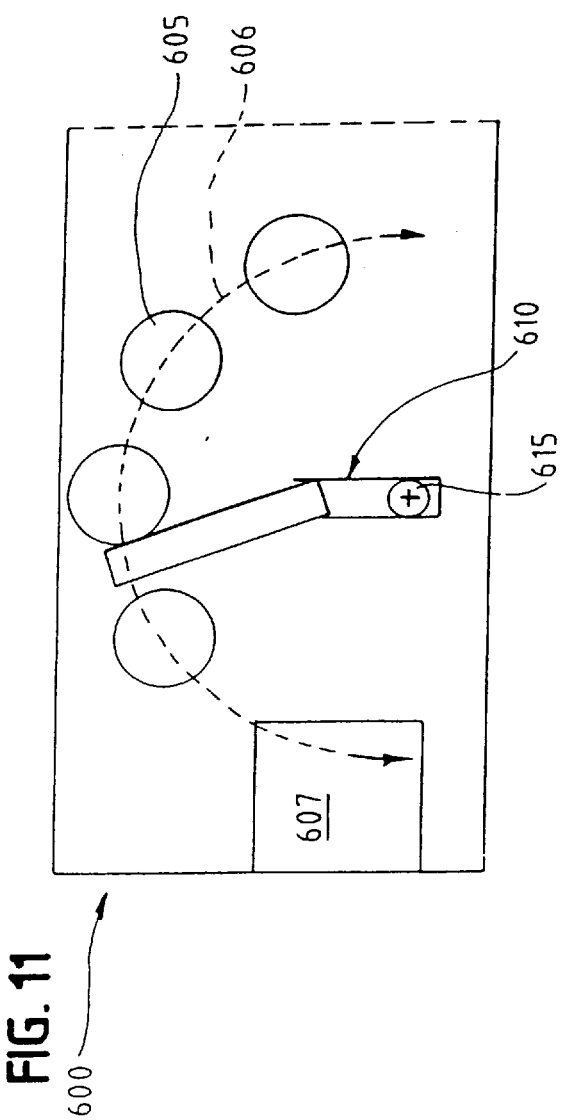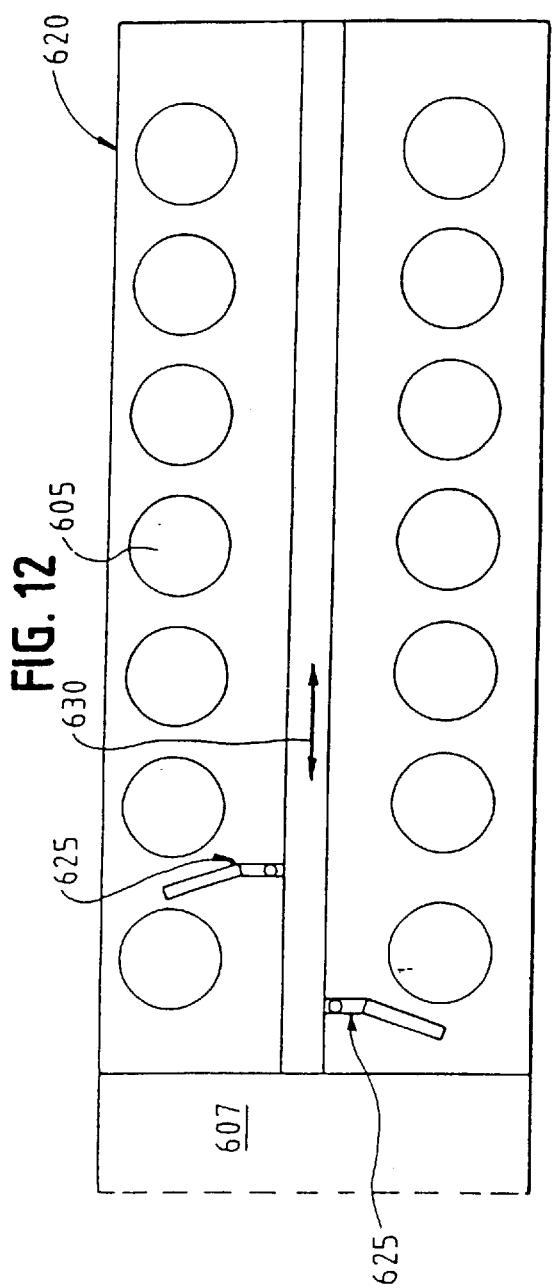

SYSTEM FOR PROCESSING A WORKPIECE

This application is a Divisional of Ser. No. 09/041,901 filed Mar. 13, 1998 now U.S. Pat. No. 6,350,319.

BACKGROUND OF THE INVENTION

The semiconductor manufacturing industry is constantly seeking to improve the processes used to manufacture integrated circuits from wafers. The improvements come in various forms but, generally, have one or more objectives as the desired goal. The objectives of many of these improved processes include: 1) decreasing the amount of time required to process a wafer to form the desired integrated circuits; 2) increasing the yield of usable integrated circuits per wafer by, for example, decreasing the likelihood of contamination of the wafer during processing; 3) reducing the number of steps required to turn a wafer into the desired integrated circuits; and 4) reducing the cost of processing the wafers into the desired integrated circuit by, for example, reducing the costs associated with the chemicals required for the processing.

In the processing of wafers, it is often necessary to subject one or more sides of the wafer to a fluid in either liquid, vapor or gaseous form. Such fluids are used to, for example, etch the wafer surface, clean the wafer surface, dry the wafer surface, passivate the wafer surface, deposit films on the wafer surface, etc. Control of the physical parameters of the processing fluids, such as their temperature, molecular composition, dosing, etc., is often quite crucial to the success of the processing operations. As such, the introduction of such fluids to the surface of the wafer occurs in a controlled environment. Typically, such wafer processing occurs in what has commonly become known as a reactor.

Various reactors have been known and used. These reactors typically have a rotor head assembly that supports the wafer. In addition to introducing the wafer into the processing chamber, the rotor head assembly may be used to spin the wafer during introduction of the processing fluid onto the surface of the wafer, or after processing to remove the processing fluid.

During processing, the wafer is presented to the rotor head assembly by a robot in a clean environment in which a number of processing reactors are present. The robot presents the wafer in an exposed state to the rotor head assembly in an orientation in which the side of the wafer that is to be processed is face up. The rotor head assembly inverts the wafer and engages and seals with a cup for processing. As the wafer is processed, the wafer is oriented so that the side of the wafer being processed is face down.

These types of reactors are useful for many of the fluid processing steps employed in the production of an integrated circuit. However, there remains a need for more control and efficiency from the reactor. As such, a substantially new approach to processing and reactor design has been undertaken which provides greater control of the fluid processes and provides for more advanced and improved processes.

SUMMARY OF THE INVENTION

An apparatus for processing a workpiece in a micro-environment is set forth. The apparatus includes a rotor motor and a workpiece housing. The workpiece housing is connected to be rotated by the rotor motor. The workpiece housing further defines a processing chamber where one or more processing fluids are distributed across at least one face of the workpiece by centrifugal force generated during rotation of the housing.

In one embodiment, the workpiece housing includes an upper chamber member and a lower chamber member joined to one another to form the processing chamber. The processing chamber preferably generally conforms to the shape of the workpiece and includes at least one fluid outlet at a peripheral region. At least one workpiece support is advantageously provided to support a workpiece in the processing chamber in a position to allow centrifugal distribution of a fluid supplied through an inlet opening into the process chamber. The fluid may be distributed across at least an upper face and/or lower face of the workpiece, when the workpiece housing is rotated. The fluid outlet is positioned to allow extraction of fluid in the processing chamber by centrifugal force.

In another embodiment, an apparatus for processing a plurality of workpieces includes a first process housing and a second process housing rotatable with the first process housing about a common rotation axis. Each process housing encloses a process chamber that substantially conforms to a workpiece. Each process housing further including a fluid inlet leading into the process chamber and a fluid outlet positioned to allow escape of fluid from the process housing via centrifugal force generated by rotation of the process housing. A fluid supply system is connected to the fluid inlet of each process housing for supplying fluid into each of the process chambers. Fluid is distributed across a surface of a workpiece within each process chamber via centrifugal force generated by rotation of the process housings. Multiple workpieces are simultaneously processed within a small amount of space.

BRIEF DESCRIPTION OF THE DRAWINGS

FIG. 1 is a cross-sectional view of a workpiece housing and a rotor assembly constructed in accordance with one embodiment of the invention.

FIG. 2 is an exploded view of a further embodiment of a workpiece housing constructed in accordance with the teachings of the present invention FIG. 3 is a top plan view of the workpiece housing of FIG. 2 when the housing is in an assembled state.

FIG. 4 is a cross-sectional view of the workpiece housing taken along line IV—IV of FIG. 3.

FIG. 5 is a cross-sectional view of the workpiece housing taken along line V—V of FIG. 3.

FIGS. 8A and 8B are cross-sectional views showing the workpiece housing in an open state and connected to a rotary drive assembly.

FIG. 9 illustrates one embodiment of an edge configuration that facilitates mutually exclusive processing of the upper and lower wafer surfaces in the workpiece housing.

FIG. 10 illustrates an embodiment of the workpiece housing employed in connection with a self-pumping re-circulation system.

FIGS. 11 and 12 are schematic diagrams of exemplary processing tools that employ the present invention.

DETAILED DESCRIPTION OF THE INVENTION

Figure 6:
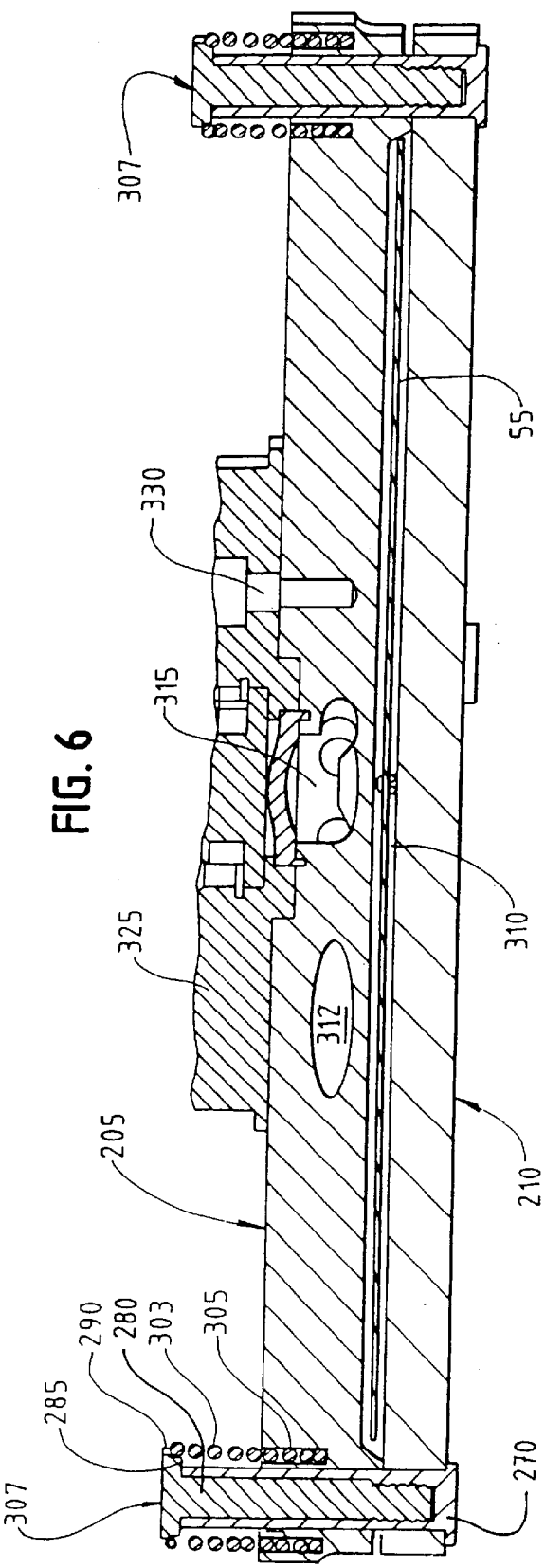
FIG. 6 is a cross-sectional view of the workpiece housing taken along line VI—VI of FIG. 3.

FIG. 1 is a cross-sectional view of one embodiment of a reactor, shown generally at 10, constructed in accordance with the teachings of the present invention. The embodiment of the reactor 10 of FIG. 1 is generally comprised of a rotor portion 15 and a workpiece housing 20. The rotor portion 15 includes a plurality of support members 25 that extend downwardly from the rotor portion 15 to engage the workpiece housing 20. Each of the support members 25 includes a groove 30 that is dimensioned to engage a radially extending flange 35 that extends about a peripheral region of the workpiece housing 20. Rotor portion 15 further includes a rotor motor assembly 40 that is disposed to rotate a hub portion 45, including the support members 25, about a central axis 47. Workpiece housing 20 is thus secured for co-rotation with hub portion 45 when support members 25 are engaged with flange 35. Other constructions of the rotor portion 15 and the engagement mechanism used for securement with the workpiece housing 20 may also be used.

The workpiece housing 20 of the embodiment of FIG. 1 defines a substantially closed processing chamber 50. Preferably, the substantially closed processing chamber 50 is formed in the general shape of the workpiece 55 and closely conforms with the surfaces of the workpiece. The specific construction of FIG. 1 includes an upper chamber member 60 having an interior chamber face 65. The upper chamber member 60 includes a centrally disposed fluid inlet opening 70 in the interior chamber face 65. The specific construction also includes a lower chamber member 75 having, an interior chamber face 80. The lower chamber member 75 has a centrally disposed fluid inlet opening 85 in the interior chamber face 80. The upper chamber member 60 and the lower chamber member 75 engage one another to define the processing chamber 50. The upper chamber member 60 includes sidewalls 90 that project downward from the interior chamber face 65. One or more outlets 100 are disposed at the peripheral regions of the processing chamber 50 through the sidewalls 90 to allow fluid within the chamber 50 to exit therefrom through centripetal acceleration that is generated when the housing 20 is rotated about axis 47.

In the illustrated embodiment, the workpiece 55 is a generally circular wafer having upper and lower planar surfaces. As such, the processing chamber 50 is generally circular in plan view and the interior chamber faces 65 and 80 are generally planar and parallel to the upper and lower planar surfaces of the workpiece 55. The spacing between the interior chamber faces 65 and 80 and the upper and lower planar surfaces of the workpiece 55 is generally quite small. Such spacing is preferably minimized to provide substantial control of the physical properties of a processing fluid flowing through the interstitial regions.

The wafer 55 is spaced from the interior chamber face 80 by a plurality of spacing members 105 extending from the interior chamber face 80. Preferably, a further set of spacing members 110 extend from the interior chamber face 65 and are aligned with the spacing members 105 to grip the wafer 55 therebetween.

Fluid inlet openings 70 and 85 provide communication passageways through which one or more processing fluids may enter the chamber 50 for processing the wafer surfaces. In the illustrated embodiment, processing fluids are delivered from above the wafer 55 to inlet 70 through a fluid supply tube 115 having a fluid outlet nozzle 120 disposed proximate inlet 70. Fluid supply tube 115 extends centrally through the rotor portion 15 and is preferably concentric with the axis of rotation 47. Similarly, processing fluids are delivered from below the wafer 55 to inlet 85 through a fluid supply tube 125. Fluid supply tube 125 terminates at a nozzle 130 disposed proximate inlet 85. Although nozzles 120 and 130 terminate at a position that is spaced from their respective inlets, it will be recognized that tubes 115 and 125 may be extended so that gaps 135 are not present. Rather, nozzles 120 and 130 or tubes 115 and 125 may include rotating seal members that abut and seal with the respective upper and lower chamber members 60 and 75 in the regions of the inlets 70 and 85. In such instances, care should be exercised in the design of the rotating joint so as to minimize any contamination resulting from the wear of any moving component.

During processing, one or more processing fluids are individually or concurrently supplied through fluid supply tubes 115 and 125 and inlets 70 and 85 for contact with the surfaces of the workpiece 55 in the chamber 50. Preferably, the housing 20 is rotated about axis 47 by the rotor portion 15 during processing to generate a continuous flow of any fluid within the chamber 50 across the surfaces of the workpiece 55 through the action of centripetal acceleration. Processing fluid entering the inlet openings 70 and 85 are thus driven across the workpiece surfaces in a direction radially outward from the center of the workpiece 55 to the exterior perimeter of the workpiece 55. At the exterior perimeter of the workpiece 55, any spent processing fluid is directed to exit the chamber 50 through outlets 100 as a result of the centripetal acceleration. Spent processing fluids may be accumulated in a cup reservoir disposed below and/or about the workpiece housing 20. As will be set forth below in an alternative embodiment, the peripheral regions of the workpiece housing 20 may be constructed to effectively separate the processing fluids provided through inlet 70 from the processing fluids supplied through inlet 85 so that opposite surfaces of wafer 55 are processed using different processing fluids. In such an arrangement, the processing fluids may be separately accumulated at the peripheral regions of the housing 20 for disposal or re-circulation.

In the embodiment of FIG. 1, the workpiece housing 20 may constitute a single wafer pod that may be used to transport the workpiece 55 between various processing stations and/or tools. If transport of the housing 20 between the processing stations and/or tools takes place in a clean room environment, the various openings of the housing 20 need not be sealed. However, if such transport is to take place in an environment in which wafer contaminants are present, sealing of the various housing openings should be effected. For example, inlets 70 and 85 may each be provided with respective polymer diaphragms having slits disposed therethrough. The ends of fluid supply tubes 115 and 125 in such instances may each terminate in a tracor structure that may be used to extend through the slit of the respective diaphragm and introduce the processing fluid into the chamber 50. Such tracor/slitted diaphragm constructions are used in the medical industry in intravenous supply devices. Selection of the polymer material used for the diaphragms should take into consideration the particular processing fluids that will be introduced therethrough. Similar sealing of the outlets 100 may be undertaken in which the tracor structures are inserted into the diaphragms once the housing 20 is in a clean room environment.

Alternatively, the outlets 100 themselves may be constructed to allow fluids from the processing chamber to exit therethrough while inhibiting the ability of fluids to proceed from the exterior of housing 20 into chamber 50. This effect may be achieved, for example, by constructing the openings 100 as nozzles in which the fluid flow opening has a larger diameter at the interior of chamber 50 than the diameter of the opening at the exterior of the housing 20. In a further construction, a rotational valve member may be used in conjunction with the plurality of outlets 100. The valve member, such as a ring with openings corresponding to the position of outlets 100, would be disposed proximate the opening 100 and would be rotated to seal with the outlets 100 during transport. The valve member would be rotated to a position in which outlets 100 are open during processing. Inert gas, such as nitrogen, can be injected into the chamber 50 through supply tubes 115 and 125 immediately prior to transport of the housing to a subsequent tool or processing station. Various other mechanisms for sealing the outlets 100 and inlets 70 and 85 may also be employed.

FIG. 2 is a perspective view of a further reactor construction wherein the reactor is disposed at a fixed processing station and can open and close to facilitate insertion and extraction of the workpiece. The reactor, shown generally at 200, is composed of separable upper and lower chamber members, 205 and 210, respectively. As in the prior embodiment, the upper chamber member 205 includes a generally planar chamber face 215 having a centrally disposed inlet 220. Although not shown in the view of FIG. 2, the lower chamber member 210 likewise has a generally planar interior chamber face 225 having a central inlet 230 disposed therethrough. The upper chamber member 205 includes a downwardly extending sidewall 235 that, for example, may be formed from a sealing polymer material or may be formed integrally with other portions of member 205.

The upper and lower chamber members, 205 and 210, are separable from one another to accept a workpiece therebetween. With a workpiece disposed between them, the upper and lower chamber members, 205 and 210, move toward one another to form a chamber in which the workpiece is supported in a position in which it is spaced from the planar interior chamber faces 215 and 225. In the embodiment of the reactor disclosed in FIGS. 2–8B, the workpiece, such as a semiconductor wafer, is clamped in place between a plurality of support members 240 and corresponding spacing members 255 when the upper and lower chamber members are joined to form the chamber (see FIG. 7B). Axial movement of the upper and lower chamber members toward and away from each other is facilitated by a plurality of fasteners 307, the construction of which will be described in further detail below. Preferably, the plurality of fasteners 307 bias the upper and lower chambers to a closed position such as illustrated at FIG. 7A.

In the disclosed embodiment, the plurality of wafer support members 240 extend about a peripheral region of the upper chamber member 205 at positions that are radially exterior of the sidewall 235. The wafer support members 240 are preferably disposed for linear movement along respective axes 245 to allow the support members 240 to clamp the wafer against the spacing members 255 when the upper and lower chamber members are in a closed position (see FIG. 7A), and to allow the support members 240 to release the wafer from such clamping action when the upper and lower chamber members are separated (see FIG. 8A). Each support member 240 includes a support arm 250 that extends radially toward the center of the upper chamber member 205. An end portion of each arm 250 overlies a corresponding spacing member 255 that extends from the interior chamber face 215. Preferably, the spacing members 255 are each in the form of a cone having a vertex terminating proximate the end of the support arm 250. Notches 295 are disposed at peripheral, portions of the lower chamber member 210 and engage rounded lower portions 300 of the wafer support members 240. When the lower chamber member 210 is urged upward to the closed position, notches 295 engage end portions 300 of the support members 240 and drive them upward to secure the wafer 55 between the arms 250 of the supports 240 and the corresponding spacing members 255. This closed state is illustrated in FIG. 5. In the closed position, the notches 295 and corresponding notches 296 of the upper chamber member (see FIG. 2) provide a plurality of outlets at the peripheral regions of the reactor 200. Radial alignment of the arm 250 of each support member 240 is maintained by a set pin 308 that extends through lateral grooves 309 disposed through an upper portion of each support member.

Figure 7A:
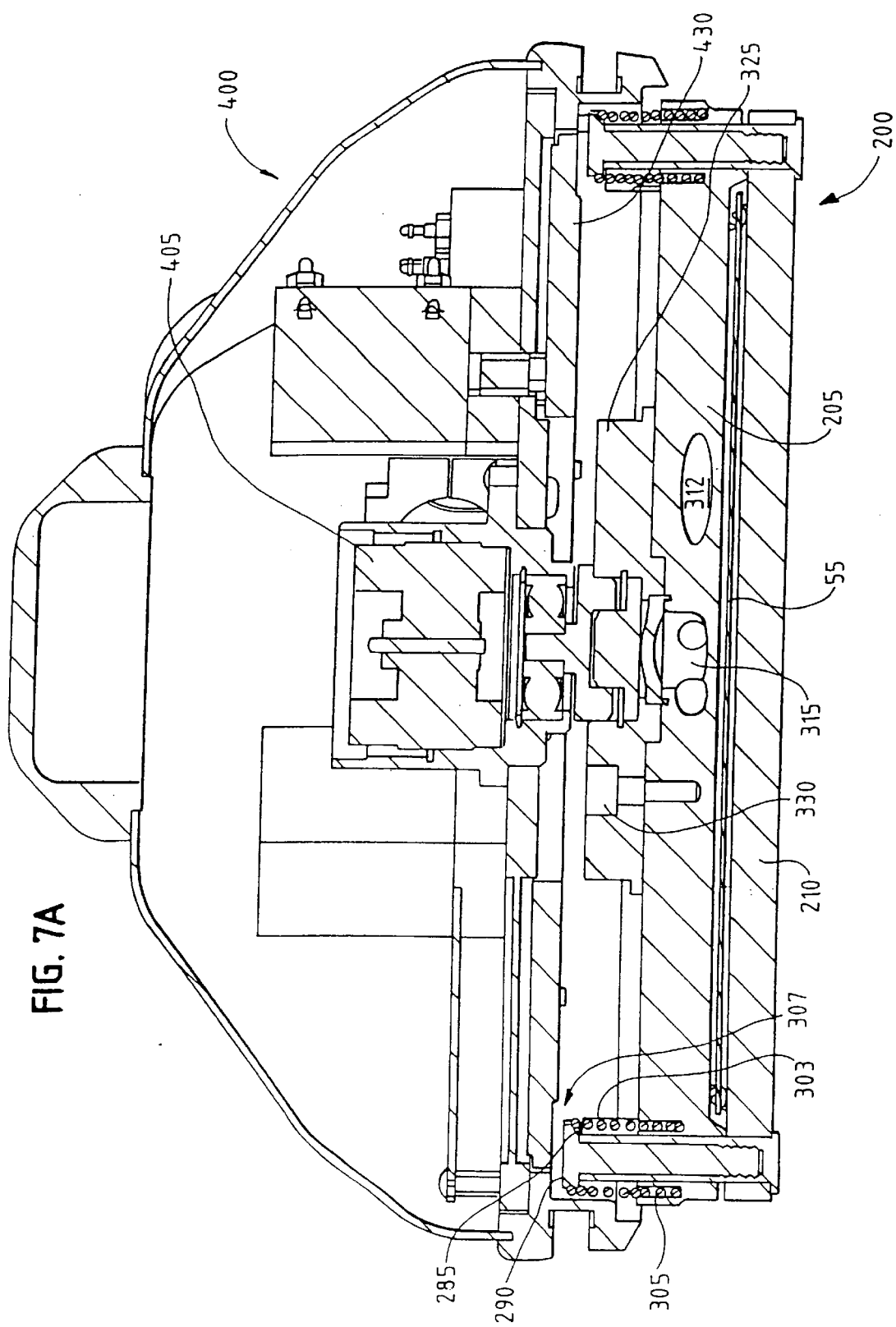
FIGS. 7A and 7B are cross-sectional views showing the workpiece, housing in a closed state and connected to a rotary drive assembly.
Figure 7B:
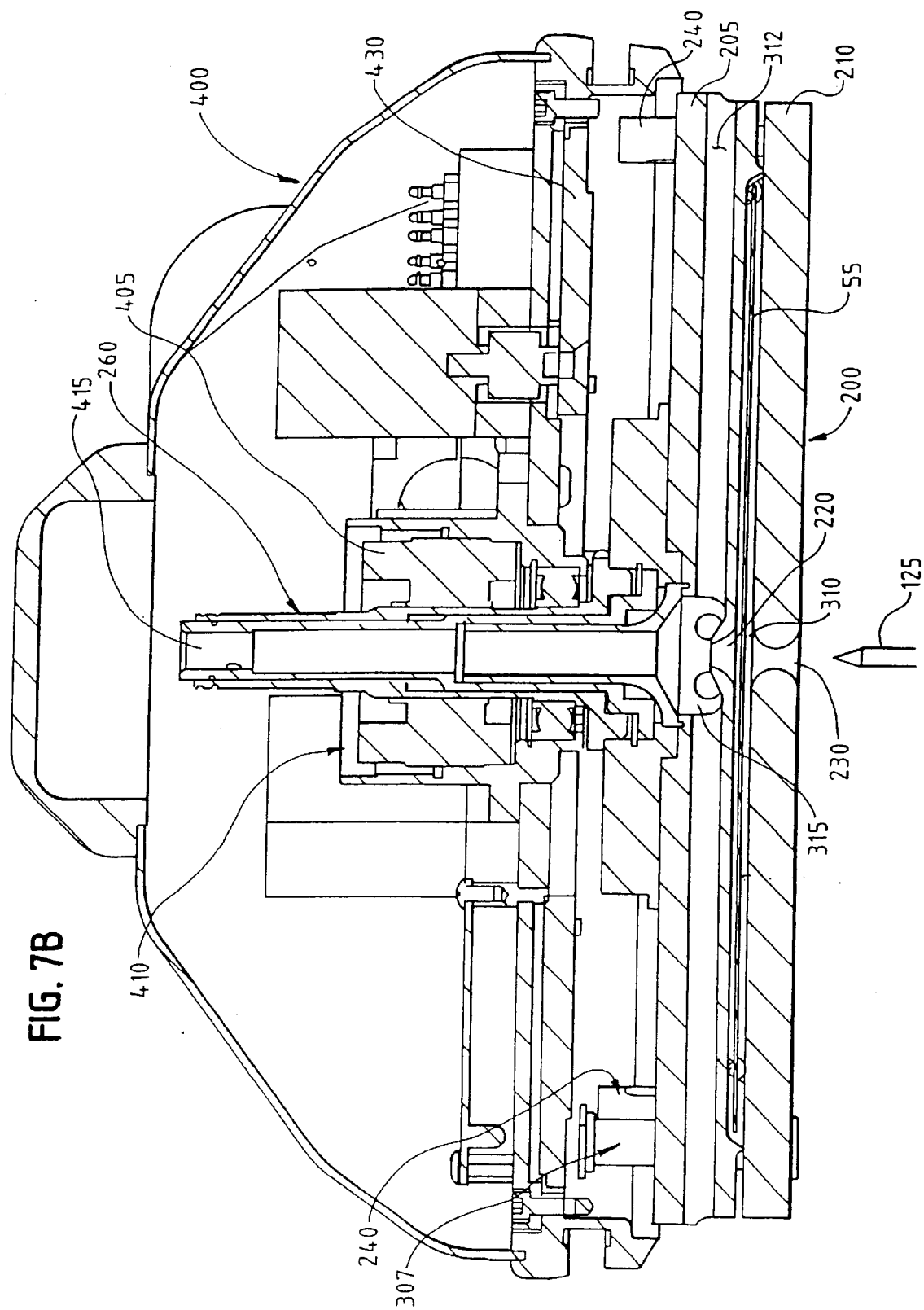

The construction of the fasteners 307 that allow the upper and lower chamber members to be moved toward and away from one another is illustrated in FIGS. 2, 6 and 7B. As shown, the lower chamber member 210 includes a plurality of hollow cylinders 270 that are fixed thereto and extend upward through corresponding apertures 275 at the peripheral region of the upper chamber member 205 to form lower portions of each fastener 307. Rods 280 extend into the hollow of the cylinders 270 and are secured to form an upper portion of each fastener 307. Together, the rods 280 and cylinders 270 form the fasteners 307 that allow relative linear movement between the upper and lower chamber members, 205 and 210, along axis 283 between the open and closed position. Two flanges, 285 and 290, are disposed at an upper portion of each rod 280. Flange 285 functions as a stop member that limits the extent of separation between the upper and lower chamber members, 205 and 210, in the open position. Flanges 290 provide a surface against which a biasing member, such as a spring (see FIG. 6) or the like, acts to bias the upper and lower chamber members, 205 and 210, to the closed position.

With reference to FIG. 6, the spring 303 or the like, has a first end that is positioned within a circular groove 305 that extends about each respective fastener 307. A second end of each spring is disposed to engage flange 290 of the respective fastener 307 in a compressed state thereby causing the spring to generate a force that drives the fastener 307 and the lower chamber member 210 upward into engagement with the upper chamber member 205.

The reactor 200 is designed to be rotated about a central axis during processing of the workpiece. To this end, a centrally disposed shaft 260 extends from an upper portion of the upper chamber member 205. As will be illustrated in further detail below in FIGS. 7A–8B, the shaft 260 is connected to engage a rotary drive motor for rotational drive of the reactor 200. The shaft 260 is constructed to have a centrally disposed fluid passageway (see FIG. 4) through which a processing fluid may be provided to inlet 220. Alternatively, the central passageway may function as a conduit for a separate fluid inlet tube or the like.

As illustrated in FIGS. 3 and 4, a plurality of optional overflow passageways 312 extend radially from a central portion of the upper chamber member 205. Shaft 260 terminates in a flared end portion 315 having inlet notches 320 that provide fluid communication between the upper portion of processing chamber 310 and the overflow passageways 312. The flared end 315 of the shaft 260 is secured with the upper chamber member 205 with, for example, a mounting plate 325. Mounting plate 325, in turn, is secured to the upper chamber member 205 with a plurality of fasteners 330 (FIG. 5). Overflow passages 312 allow processing fluid to exit the chamber 310 when the flow of fluid to the chamber 310 exceeds the fluid flow from the peripheral outlets of the chamber.

Figure 8A:
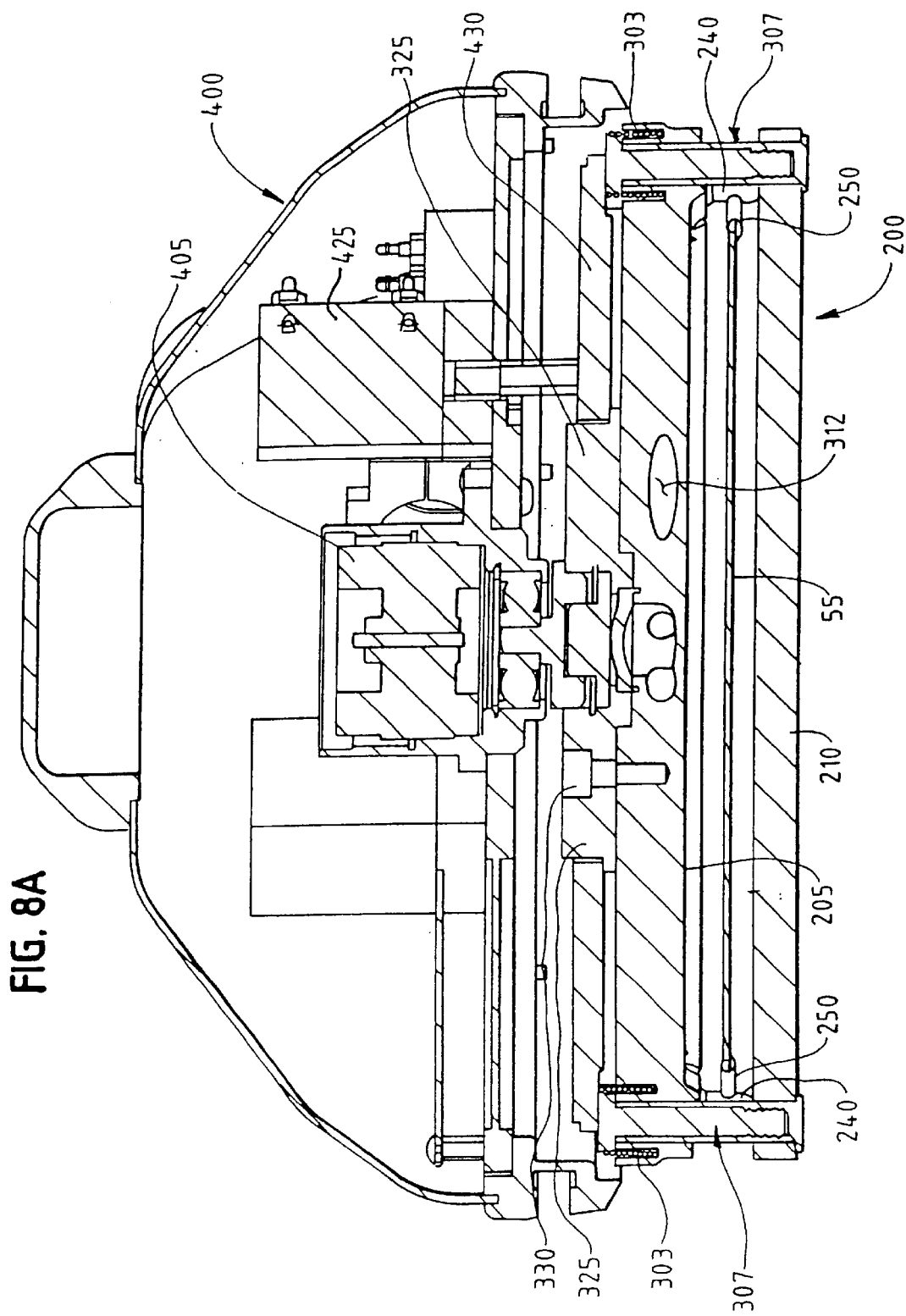

FIGS. 7A and 7B are cross-sectional views showing the reactor 200 in a closed state and connected to a rotary drive assembly, shown generally at 400, while FIGS. 8A and 8B are similar cross-sectional views showing the reactor 200 in an opened state. As shown, shaft 260 extends upward into the rotary drive assembly 400. Shaft 260 is provided with the components necessary to cooperate with a stator 405 to form a rotary drive motor assembly 410.

As in the embodiment of FIG. 1, the upper and lower chamber members 205 and 210 join to define the substantially closed processing chamber 310 that, in the preferred embodiment, substantially conforms to the shape of the workpiece 55. Preferably, the wafer 55 is supported within the chamber 310 in a position in which its upper and lower faces are spaced from the interior chamber faces 215 and 225. As described above, such support is facilitated by the support members 240 and the spacing members 255 that clamp the peripheral edges of the wafer 55 therebetween when the reactor 200 is in the closed position of FIGS. 7A and 7B.

It is in the closed state of FIGS. 7A and 7B that processing of the wafer 55 takes place. With the wafer secured within the processing chamber 310, processing fluid is provided through passageway 415 of shaft 260 and inlet 220 into the interior of chamber 310. Similarly, processing fluid is also provided to the chamber 310 through a processing supply tube 125 that directs fluid flow through inlet 230. As the reactor 200 is rotated by the rotary drive motor assembly 410, any processing fluid supplied through inlets 220 and 230 is driven across the surfaces of the wafer 55 by forces generated through centripetal acceleration. Spent processing fluid exits the processing chamber 310 from the outlets at the peripheral regions of the reactor 200 formed by notches 295 and 296. Such outlets exist since the support members 240 are not constructed to significantly obstruct the resulting fluid flow. Alternatively, or in addition, further outlets may be provided at the peripheral regions.

Once processing has been completed, the reactor 200 is opened to allow access to the wafer, such as shown in FIGS. 8A and 8B. After processing, actuator 425 is used to drive an actuating ring 430 downward into engagement with upper portions of the fasteners 307. Fasteners 307 are driven against the bias of spring 303 causing the lower chamber member 210 to descend and separate from the upper chamber member 205. As the lower chamber member 210 is lowered, the support members 240 follow it under the influence of gravity, or against the influence of a biasing member, while concurrently lowering the wafer 55. In the lower position, the reactor chamber 310 is opened thereby exposing the wafer 55 for removal and/or allowing a new wafer to be inserted into the reactor 200. Such insertion and extraction can take place either manually, or by an automatic robot.

FIG. 9 illustrates an edge configuration that facilitates separate processing of each side of the wafer 55. As illustrated, a dividing member 500 extends from the sidewall 235 of the processing chamber 310 to a position immediately proximate the peripheral edge 505 of the wafer 55. The dividing member 500 may take on a variety of shapes, the illustrated tapered shape being merely one configuration. The dividing member 500 preferably extends about the entire circumference of the chamber 310. A first set of one or more outlets 510 is disposed above the dividing member 500 to receive spent processing fluid from the upper surface of the wafer 55. Similarly, a second set of one or more outlets 515 is disposed below the dividing member 500 to receive spent processing fluid from the lower surface of the wafer 55. When the wafer 55 rotates during processing, the fluid through supply 415 is provided to the upper surface of the wafer 55 and spreads across the surface through the action of centripetal acceleration. Similarly, the fluid from supply tube 125 is provided to the lower surface of the wafer 55 and spreads across the surface through the action of centripetal acceleration. Because the edge of the dividing member 500 is so close to the peripheral edge of the wafer 55, processing fluid from the upper surface of the wafer 55 does not proceed below the dividing member 500, and processing fluid from the lower surface of the wafer 55 does not proceed above the dividing member 500. As such, this reactor construction makes it possible to concurrently process both the upper and lower surfaces of the wafer 55 in a mutually exclusive manner using different processing fluids and steps.

FIG. 9 also illustrates one manner in which the processing fluids supplied to the upper and lower wafer surfaces may be collected in a mutually exclusive manner. As shown, a fluid collector 520 is disposed about the exterior periphery of the reactor 200. The fluid collector 520 includes a first collection region 525 having a splatter stop 530 and a fluid trench 535 that is structured to guide fluid flung from the outlets 510 to a first drain 540 where the spent fluid from the upper wafer surface may be directed to a collection reservoir for disposal or re-circulation. The fluid collector 520 further includes a second collection region 550 having a further splatter stop 555 and a further fluid trench 560 that is structured to guide fluid flung from the outlets 515 to a second drain 565 where the spent fluid from the lower wafer surface may be directed to a collection reservoir for disposal or re-circulation.

FIG. 10 illustrates an embodiment of the reactor 200 having an alternate configuration for supplying processing fluid through the fluid inlet opening 230. As shown, the workpiece housing 20 is disposed in a cup 570. The cup 570 includes sidewalls 575 exterior to the outlets 100 to collect fluid as it exits the chamber 310. An angled bottom surface 580 directs the collected fluid to a sump 585. Fluid supply line 587 is connected to provide an amount of fluid to the sump 585. The sump 585 is also preferably provided with a drain valve 589. An inlet stem 592 defines a channel 595 that includes a first end having an opening 597 that opens to the sump 585 at one end thereof and a second end that opens to the inlet opening 230.

In operation of the embodiment shown in FIG. 10, processing fluid is provided through supply line 587 to the sump 585 while the reactor 200 is spinning. Once the sump 585 is full, the fluid flow to the sump through supply line 587 is eliminated. Centripetal acceleration resulting from the spinning of the reactor 200 provides a pressure differential that drives the fluid through openings 597 and 230, into chamber 310 to contact at least the lower surface of the wafer 55, and exit outlets 100 where the fluid is re-circulated to the sump 585 for further use.

There are numerous advantages to the self-pumping re-circulation system illustrated in FIG. 10. The tight fluid loop minimizes lags in process parameter control thereby making it easier to control such physical parameters as fluid temperature, fluid flow, etc. Further, there is no heat loss to plumbing, tank walls, pumps, etc. Still further, the system does not use a separate pump, thereby eliminating pump failures which are common when pumping hot, aggressive chemistries.

FIGS. 11 and 12 illustrate two different types of processing tools, each of which may employ one or more processing stations including the reactor constructions described above. FIG. 11 is a schematic block diagram of a tool, shown generally at 600, including a plurality of processing stations 605 disposed about an arcuate path 606. The processing stations 605 may all perform similar processing operations on the wafer, or may perform different but complementary processing operations. For example, one or more of the processing stations 605 may execute an electrodeposition process of a metal, such as copper, on the wafer, while one or more of the other processing stations perform complementary processes such as, for example, clean/dry processing, pre-wetting processes, photoresist processes, etc.

Wafers that are to be processed are supplied to the tool 600 at an input/output station 607. The wafers may be supplied to the tool 600 in, for example, S.M.I.F. pods, each having a plurality of the wafers disposed therein. Alternatively, the wafers may be presented to the tool 600 in individual workpiece housings, such as at 20 of FIG. 1.

Each of the processing stations 605 may be accessed by a robotic arm 610. The robotic arm 610 transports the workpiece housings, or individual wafers, to and from the input/output station 607. The robotic arm 610 also transports the wafers or housings between the various processing stations 605.

In the embodiment of FIG. 11, the robotic arm 610 rotates about axis 615 to perform the transport operations along path 606. In contrast, the tool shown generally at 620 of the FIG. 12 utilizes one or more robotic arms 625 that travel along a linear path 630 to perform the required transport operations. As in the embodiment of FIG. 10, a plurality of individual processing stations 605 are used, but more processing stations 605 may be provided in a single processing tool in this arrangement.

Figure 13:
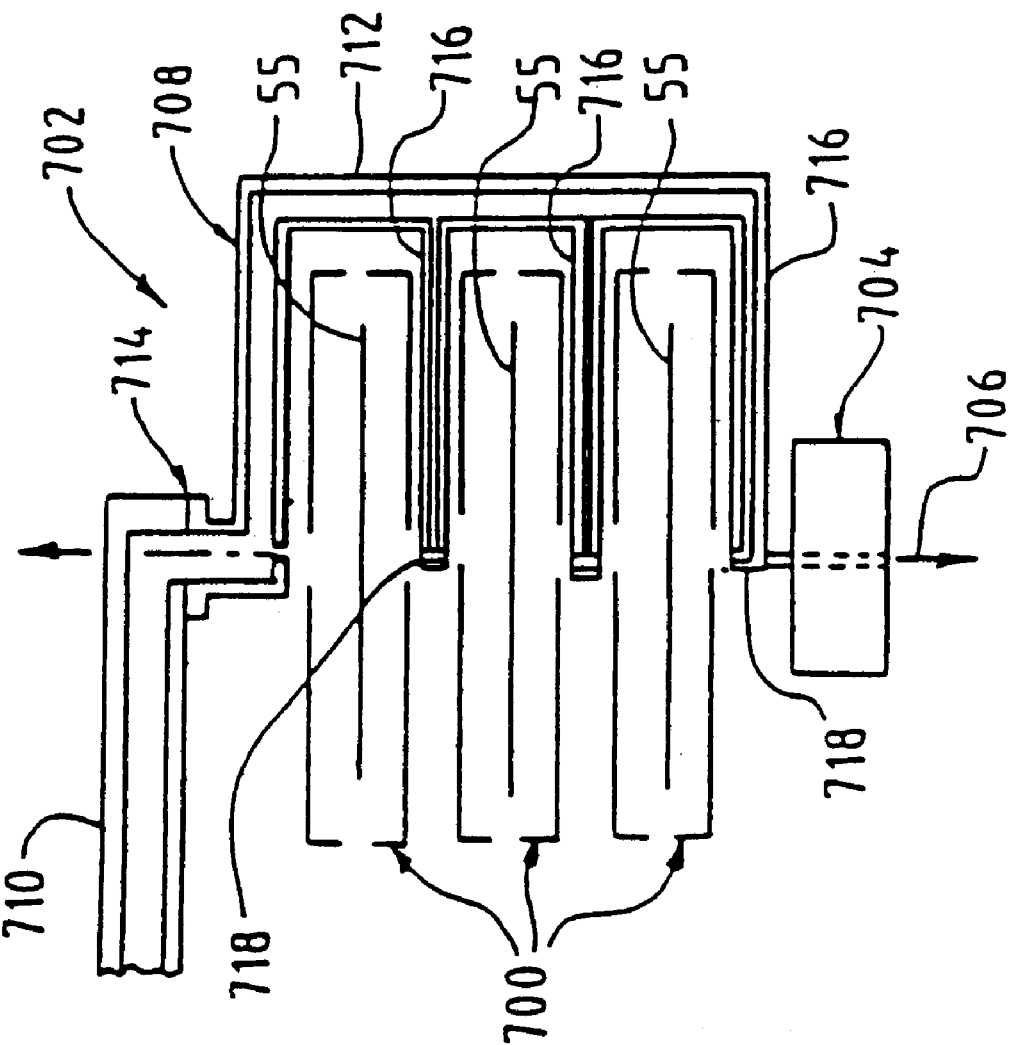
FIG. 13 illustrates a batch wafer processing tool constructed in accordance with the principles of the present invention.

FIG. 13 illustrates one manner of employing a plurality of workpiece housings 700, such as those described above, in a batch processing apparatus 702. As shown, the workpiece housings 700 are stacked vertically with respect to one another and are attached for rotation by a common rotor motor 704 about a common rotation axis 706. The apparatus 702 further includes a process fluid delivery system 708. The delivery system 708 includes a stationary manifold 710 that accepts processing fluid from a fluid supply (not shown). The stationary manifold 710 has an outlet end connected to the input of a rotating manifold 712. The rotating manifold 712 is secured for co-rotation with the housings 700 and, therefore, is connected to the stationary manifold 710 at a rotating joint 714. A plurality of fluid supply lines 716 extend from the rotating manifold 712 and terminate at respective nozzle portions 718 proximate inlets of the housings 700. Nozzle portions 718 that are disposed between two housings 700 are constructed to provide fluid streams that are directed in both the upward and downward directions. In contrast, the lowermost supply line 716 includes a nozzle portion 718 that directs a fluid stream only in the upward direction. The uppermost portion of the rotating manifold 712 includes an outlet 720 that provides processing fluid to the fluid inlet of the uppermost housing 700.

The batch processing apparatus 702 of FIG. 13 is constructed to concurrently supply the same fluid to both the upper and lower inlets of each housing 700. However, other configurations may also be employed. For example, nozzle portions 718 may include valve members that selectively open and close depending on whether the fluid is to be supplied through the upper and/or lower inlets of each housing 700. In such instances, it may be desirable to employ an edge configuration, such as the one shown in FIG. 9, in each of the housings 700 to provide isolation of the fluids supplied to the upper and lower surfaces of the wafers 55. Still further, the apparatus 702 may include concentric manifolds for supplying two different fluids concurrently to individual supply lines respectively associated with the upper and lower inlets of the housings 700.

Numerous substantial benefits flow from the use of the disclosed reactor configurations. Many of these benefits arise directly from the reduced fluid flow areas in the reactor chambers. Generally, there is a more efficient use of the processing fluid since very little of the fluids are wasted. Further, it is often easier to control the physical parameters of the fluid flow, such as temperature, mass flow, etc., using the reduced fluid flow areas of the reactor chambers. This gives rise to more consistent results and makes those results repeatable.

The foregoing constructions also give rise to the ability to perform sequential processing of a single wafer using two or more processing fluids sequentially provided through a single inlet of the reaction chamber. Still further, the ability to concurrently provide different fluids to the upper and lower surfaces of the wafer opens the opportunity to implement novel processing operations. For example, a processing fluid, such as HF liquid, may be supplied to a lower fluid inlet of the reaction chamber for processing the lower wafer surface while an inert fluid, such as nitrogen gas, may be provided to the upper fluid inlet. As such, the HF liquid is allowed to react with the lower surface of the wafer while the upper surface of the wafer is effectively isolated from HF reactions. Numerous other novel processes may also be implemented.

The present invention has been illustrated with respect to a wafer. However, it will be recognized that the present invention has a wider range of applicability. By way of example, the present invention is applicable in the processing of disks and heads, flat panel displays, microelectronic masks, and other devices requiring effective and controlled wet processing.

Numerous modifications may be made to the foregoing system without departing from the basic teachings thereof. Although the present invention has been described in substantial detail with reference to one or more specific embodiments, those of skill in the art will recognize that changes may be made thereto without departing from the scope and spirit of the invention as set forth in the appended claims.

What is claimed is:

1. An apparatus for processing a plurality of workpieces comprising:
    a first process housing and a second process housing rotatable with the first process housing about a common rotation axis, and with each process housing enclosing a process chamber that substantially conforms to a workpiece, each process housing further including a fluid inlet leading into the process chamber and a fluid outlet positioned to allow escape of fluid from the process housing via centrifugal force generated by rotation of the process housing;
    a fluid supply system in communication with the fluid inlet of each process housing for supplying fluid into each of the process chambers, wherein fluid is distributed across a surface of a workpiece within each process chamber via centrifugal force generated by rotation of the process housings.

2. The apparatus of claim 1 wherein the first and second process housings are stacked vertically with respect to one another, and with each workpiece in a substantially horizontal plane.

3. The apparatus of claim 1 wherein the fluid supply system includes a stationary manifold in communication with a rotating manifold, and wherein the stationary manifold supplies fluid to the rotating manifold.

4. The apparatus of claim 3 wherein the fluid supply system further includes a plurality of fluid supply lines, each fluid supply line extending from the rotating manifold to a region adjacent to the fluid inlet of at least one of the process housings.

5. The apparatus of claim 4 wherein at least one of the fluid supply lines terminates at a nozzle portion adjacent to the fluid inlet of at least one process housing, and with the nozzle portion providing a fluid stream through the fluid inlet of the at least one process housing.

6. The apparatus of claim 5 wherein at least one nozzle portion is disposed between two process housings and provides a fluid stream into the fluid inlet of each of the two process housings.

7. The apparatus of claim 3 wherein the rotating manifold is connected for co-rotation with the process housings.

8. The apparatus of claim 3 wherein an upper portion of the rotating manifold includes a fluid outlet through which fluid is provided to the fluid inlet of one process housing.

9. The apparatus of claim 1 wherein each process housing includes an upper fluid inlet for directing fluid onto an upper surface of the workpiece disposed therein, and a lower fluid inlet for directing fluid onto a lower surface of the workpiece disposed therein.

10. The apparatus of claim 9 wherein the fluid supply system concurrently supplies the same fluid to the upper fluid inlet as to the lower fluid inlet of each process housing.

11. The apparatus of claim 9 wherein the fluid supply system concurrently supplies a different fluid to the upper fluid inlet than to the lower fluid inlet of each process housing.

12. An apparatus for processing a plurality of workpieces comprising:
   a rotor motor;
   a plurality of process housings rotatably connected to the rotor motor about a common axis of rotation, each process housing enclosing a process chamber that substantially conforms to a workpiece;
   a fluid supply system in communication with each of the process housings for supplying fluid into each of the process chambers, wherein fluid is distributed across a surface of each workpiece via centrifugal acceleration generated by rotation of the process housings.

13. The apparatus of claim 12 wherein each process housing includes a fluid inlet in communication with the fluid supply system and leading into the process chamber, and a fluid outlet disposed at a periphery of the process chamber to allow escape of fluid from the process housing via centrifugal acceleration generated by rotation of the process housing.

14. The apparatus of claim 12 wherein the fluid supply system includes a stationary manifold in communication with a rotating manifold, the stationary manifold adapted to supply fluid to the rotating manifold.

15. The apparatus of claim 14 wherein the fluid supply system further includes a plurality of fluid supply lines, each fluid supply line extending from the rotating manifold to a region proximate to a fluid inlet in one of the process housings.

16. The apparatus of claim 15 wherein at least one of the fluid supply lines terminates at a nozzle portion disposed proximate to the fluid inlet, the nozzle portion providing a fluid stream through the fluid inlet.

17. The apparatus of claim 16 wherein at least one nozzle portion is disposed between two process housings and provides a fluid stream into a fluid inlet of each of the two process housings.

18. The apparatus of claim 14 wherein the rotating manifold is connected for co-rotation with the process housings.

19. The apparatus of claim 14 wherein an upper portion of the rotating manifold includes a fluid outlet through which fluid is provided to a fluid inlet in one process housing.

20. The apparatus of claim 12 wherein each process housing includes an upper fluid inlet in communication with the fluid supply system for directing fluid onto an upper surface of the workpiece disposed therein, and a lower fluid inlet in communication with the fluid supply system for directing fluid onto a lower surface of the workpiece disposed therein.

21. The apparatus of claim 12 wherein the fluid supply system is adapted to sequentially supply a rinsing fluid followed by a drying fluid into each of the process chambers.

* * * * *